(12) United States Patent
Franz et al.

(10) Patent No.: US 7,746,654 B2
(45) Date of Patent: Jun. 29, 2010

(54) ADAPTABLE PLUG-IN MEZZANINE CARD FOR BLADE SERVERS

(75) Inventors: John P. Franz, Houston, TX (US); Walton S. Little, Jr., Houston, TX (US); Tuan A. Pham, Houston, TX (US); John D. Nguyen, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 386 days.

(21) Appl. No.: 11/811,311

(22) Filed: Jun. 7, 2007

(65) Prior Publication Data
US 2008/0304223 A1    Dec. 11, 2008

(51) Int. Cl.
*H05K 5/00* (2006.01)
(52) U.S. Cl. .......... 361/724; 361/679.02; 361/728; 439/44
(58) Field of Classification Search .......... 361/720
See application file for complete search history.

(56) References Cited

U.S. PATENT DOCUMENTS

| | | | | |
|---|---|---|---|---|
| 5,008,777 | A * | 4/1991 | Burns | 361/804 |
| 5,583,749 | A | 12/1996 | Tredennick | |
| 5,903,439 | A * | 5/1999 | Tamarkin | 361/742 |
| 6,567,271 | B2 * | 5/2003 | Stone et al. | 361/724 |
| 6,661,675 | B2 * | 12/2003 | Brosowski | 361/785 |
| 6,731,515 | B2 * | 5/2004 | Rhoads | 361/796 |
| 6,768,642 | B2 | 7/2004 | Hines | |
| 6,804,112 | B2 * | 10/2004 | Klimke et al. | 361/800 |
| 6,805,560 | B1 * | 10/2004 | Budny et al. | 439/65 |
| 6,863,572 | B1 * | 3/2005 | Yi et al. | 439/637 |
| 6,935,868 | B1 | 8/2005 | Campini | |
| 7,082,487 | B2 * | 7/2006 | Darwish et al. | 710/301 |
| 7,172,432 | B2 * | 2/2007 | Campini et al. | 439/74 |
| 7,212,961 | B2 * | 5/2007 | Settles | 703/23 |
| 7,539,026 | B2 * | 5/2009 | Finnerty et al. | 361/803 |
| 7,561,439 | B2 * | 7/2009 | Orr et al. | 361/796 |
| 2002/0097563 | A1 * | 7/2002 | Costner | 361/735 |
| 2002/0122296 | A1 | 9/2002 | Stone | |
| 2002/0181216 | A1 * | 12/2002 | Kledzik et al. | 361/790 |
| 2005/0186807 | A1 * | 8/2005 | Budny et al. | 439/65 |
| 2006/0221590 | A1 | 10/2006 | Campini | |

* cited by examiner

*Primary Examiner*—Jayprakash N Gandhi
*Assistant Examiner*—Anthony Q Edwards (57) ABSTRACT

A computer system is provided that includes a chassis, a system board coupled to the chassis, and a first connector extending from the system board at a first height and configured to receive a first printed circuit board, wherein the first printed circuit board is configured to be parallel to the system board when received by the first connector, and a second connector extending from the system board at a second height and configured to receive a second printed circuit board, wherein the second printed circuit board is configured to be parallel to the system board when received by the second connector. Other computer systems are provided that include a first mezzanine card and a second mezzanine card or multiple connectors and a plurality of printed circuit boards.

17 Claims, 8 Drawing Sheets

ADAPTABLE PLUG-IN MEZZANINE CARD FOR BLADE SERVERS

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Computer servers are used by a wide array of users in various configurations. Server systems often comprise multiple server blades housed in a chassis and/or in standard rack mount. As processing needs and computing performance have increased, server blades have become more powerful while being reduced in size. Thus, chassis and rack mount systems are capable of enclosing an increasing number of these small form factor server blades that deliver an increasing amount of performance. While the server blades are intended to be fully functional computer servers, sometimes it is desirable to add functionality or interfaces to a server blade through the use of expansion cards, such as peripheral circuit interconnect (PCI) cards. Conventional expansion cards, in which the card inserts perpendicular to the system board of the server, are usually not feasible in a server blade in which the chassis height is much smaller than a standard rack server. Expansion cards for blade servers may have a mezzanine design, in which the expansion card is inserted or installed parallel to the system board of the server. The installation and configuration of such mezzanine expansion cards introduces a number of design challenges and considerations.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in greater detail below, one or more embodiments of the present invention provide a server blade having a novel staggered mezzanine card system, allowing installation of one or more mezzanine cards and multiple mezzanine card configurations. Prior solutions for server blade expansion cards have no unifying design that allow sharing across multiple platforms. Previous expansion cards use multiple printed circuit board (PCB) sizes and do not provide a consistent footprint that would aid in easing design around the expansion card. Existing designs do not use connectors that provide for high speed bandwidth for future expansion. Additionally, high-speed expansion cards may be required to use multiple connectors to achieve the required bandwidth and throughput, adding to the cost and routing difficulties. Finally, the height of the connectors on both the system board and the expansion cards can add to design problems. For example, if the connectors are too short, they may limit the placement of components on the system board. If the connectors are too long, they waste space and may limit the placement of components on the expansion cards.

In one embodiment, two mezzanine cards are installed in a staggered configuration from a system board of a server blade using system board connectors protruding from the system board at different heights. In another embodiment, a mezzanine card installed on a system board spans two connectors, while remaining in a staggered arrangement with another mezzanine card. Installing the mezzanine cards at different heights in a staggered configuration provides for the mezzanine cards to have the smallest footprint on the system board, yet allow space for all necessary components, heat sinks, and air flow for cooling. Further, by minimizing the footprint and vertical height of the staggered mezzanine cards, space and design flexibility are preserved for other areas of the blade server. Additionally, the mezzanine cards are designed to be flexible across multiple server blade designs and upgradeable for future servers and I/O architectures. In another embodiment, a mezzanine card using multiple system board connectors is installed into a system board of a blade server. A mezzanine card may advantageously use multiple connectors to increase I/O bandwidth and functionality as compared to a mezzanine card using one system board connector. Finally, the implementation of the staggered mezzanine card system and a mezzanine card capable of spanning multiple system connectors provides for multiple configurations and flexibility with regard to possible configurations of the server blade.

In one embodiment, a blade server may be one of two sizes, referred to as a Half High or a Full High server. The Half High server may have a height of approximately 7.5 inches, while the Full High server may have a height of approximately 14 inches. Both servers may be used in a rack mount system as discussed further below. A Full High server, because of the larger height, may accommodate more components or expansion cards as compared to a Half High server. In this embodiment, a Half High or Full High server may be selected based on the requirements of the end application. For example, more Half High servers will fit in a rack mount system than Full High servers.

In addition to two server blade sizes, in one embodiment the mezzanine cards discussed herein may be one of three sizes (small, medium, and large), and referred to as Type I, Type II, or Type III. Advantageously, each size may be designed to be flexible across multiple types and/or sizes of server blades and upgradeable for future server blade designs and I/O architectures. Further, each size of the mezzanine cards may be designed to provide enough space and air flow inside a server blade and provide flexibility for other components of the server blade. A Type I mezzanine card may have a width of 4.5 inches and a length of 4 inches. A Type II mezzanine card may have a width of 4.5 inches and a length of 5.3 inches, and a Type III mezzanine card may have a width of 4.5 inches and a length of 10.6 inches. Thus, by maintaining the same width dimension for each size up a mezzanine card, and only varying the length dimension, the footprint of the mezzanine cards may be minimized, even when installed in the staggered arrangement discussed further herein. For example, when stacked upon each other the footprint of two Type I cards or Type II cards only increases by 1.35 inches. Further, maintaining the same width dimension for each card and standardizing the footprint allows sharing of the different size cards across multiple blade server designs.

Figure 1:
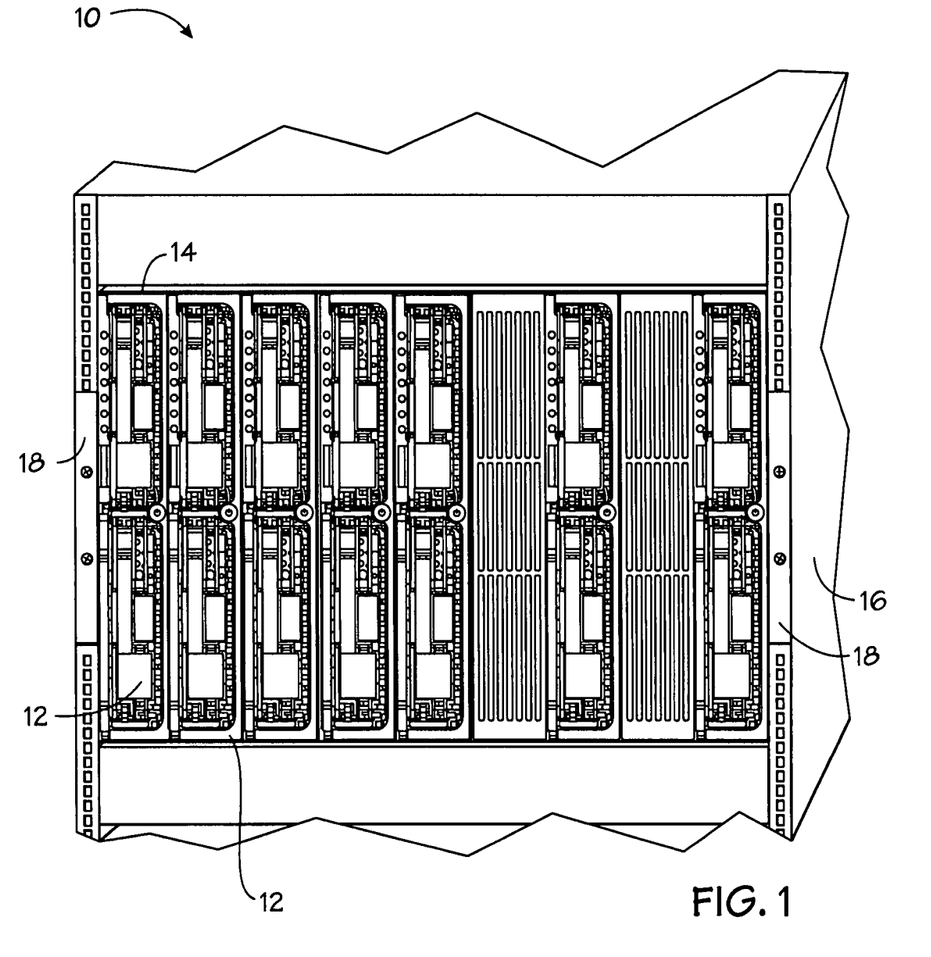
FIG. 1 is a perspective view illustrating a rack mount system having a plurality of modular server blades in accordance with one embodiment of the present invention.

Turning now to the figures, an exemplary rack mount system 10 is illustrated in FIG. 1. In the exemplary embodiment, the rack mount system 10 includes a number of computer servers 12 disposed within a chassis or enclosure 14. The chassis 14 is disposed in a rack structure or housing 16 and mounted thereto via mounting brackets 18. The servers 12 are modular, in that additional components may be externally mounted to servers 12 to convert or upgrade the servers 12. As will be appreciated, other components disposed in the rack structure 16 may include additional computer servers, power supplies, operator interfaces, and the like. It should also be noted that the rack structure 16 may have any number and configuration of rack mount receptacles having supports, such as manual or automatic rail mechanisms that support the servers 12, the chassis 14, or various other components (not shown). It should be noted that, although the exemplary servers 12 are illustrated as blade servers, the disclosed techniques are generally applicable to electronic devices including non-blade computer servers.

A server blade 12 may include a number of configurations to provide various functions in the system 10. Internally, a server 12 may include a printed circuit assembly (PCA) including a system board, hard disk drives, volatile or non-volatile memory devices, processors and controllers. Thus, the servers 12 provide processing and computational services and capabilities in a high density arrangement in the rack structure 16. For a server 12 to perform these tasks within a rack mount system 10, interface signals and power may be delivered to the server 12. Power may include a 12V power provided to the server 12 from a power supply located in the chassis 14 or rack structure 16, for example. Interface signals may include data transmitted from a user on a system network, or data transmitted between servers 12.

Each server 12 may have the ability to accept any number of expansion cards to add functionality or interfaces to the server 12. The added interfaces may provide for connection to the rack structure 16 or other servers 12 in the system. Expansion cards may be installed into a server 12 during assembly, before installation into the rack structure 16, or such expansion cards may be added to a server 12 after assembly if new functionality or interfaces are required. In this manner, expansion cards allow a server 12 to utilize new technology and interfaces without replacement of the server 12. The expansion cards may be PCBs of insulating material and conductive traces. The expansion card PCBs may have one or more controllers, microchips, memory chips, connectors, or other integrated circuits or electrical components mounted to the PCB.

Because the exemplary servers 12 shown are blade servers with limited chassis heights, the expansion cards used in the exemplary embodiment may be mezzanine cards that install parallel to the system board of the server 12. As used herein, a "mezzanine card" refers to an expansion card that is coupled directly to another board, such as a system board, such that the card is parallel to the board. The expansion cards may include I/O cards such as hard drive backplanes and/or network cards that add Gigabit Ethernet, Fiberchannel, Infiniband, or any other network interface or technology.

Figure 2:
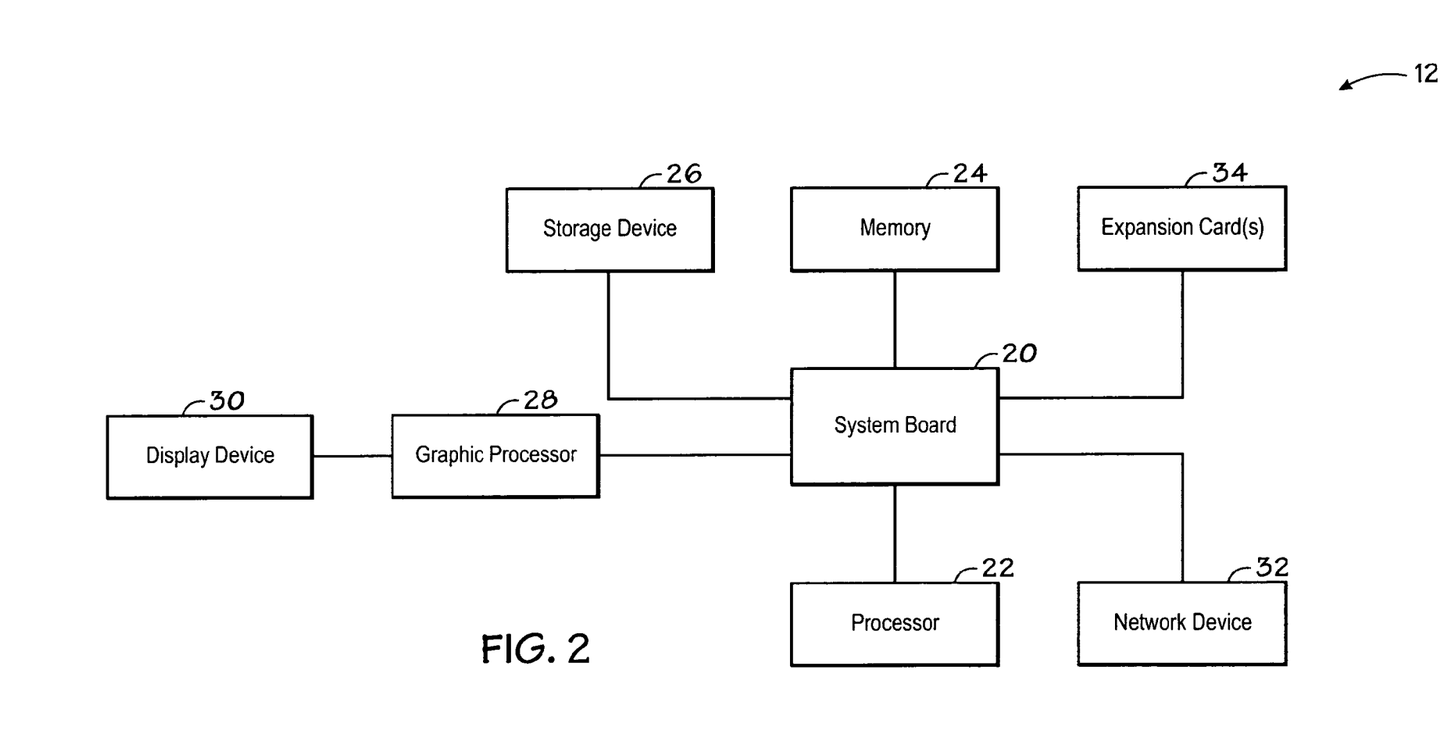
FIG. 2 is a block diagram of a modular server blade in accordance with one embodiment of the present invention.

FIG. 2 depicts a block diagram of a server blade 12 in accordance with an embodiment of the present invention. The server blade 12 has a system board 20 that may have multiple connectors, sockets or any type of interface for connecting the various components described herein. Further, any of the components described in FIG. 2 may be integrated onto the system board 20. The system board 20 may include various controllers, busses, hubs or other systems for communicating or controlling any of the components described herein or other components not shown. The system board 20 is connected to one or more processors 22, which may be general purpose or custom-designed processors. For example, in some embodiments the processors 22 may be Xeon or Itanium 2 processors manufactured by Intel, or Opteron processors manufactured by Advanced Micro Devices. The system board 20 is also connected to a memory 24, which includes both a non-volatile memory, such as ROM or flash memory, and a volatile memory, such as DRAM. The server 12 may also include a storage device 26 connected to the system board 20, such as a hard disk drive.

The server 12 may also include a graphics processor 28 connected to the system board 20, such as a video card or integrated graphics processor, connected to a display device 30. The display device may include an LCD, an SED display, a CRT display, a DLP display, a plasma display, an OLED display, or an LED display. In some embodiments, the server 12 may be connected to a display device 30 through the rack mount system 10, or the server 12 may not include a display device 30. The server 12 may also include a network device 32, such as a network interface card or integrated network interface. The network device may provide for connection to any kind of network, such as Ethernet, Fiberchannel, Infinitband, etc. Additionally, the server 12 may include one or more mezzanine expansion cards 34. As discussed further below, the mezzanine expansion cards 34 may be installed in the server in a staggered arrangement at different heights from the system board 20. As used herein, the term "staggered" or "staggered arrangement" refers to one or more cards extending at different heights from a system board, in which some portion or all of each card may overlap another card. The expansion cards 34 may include I/O cards and/or network cards that add Gigabit Ethernet, Fiberchannel, Infiniband, or any other network interface or technology.

Figure 3:
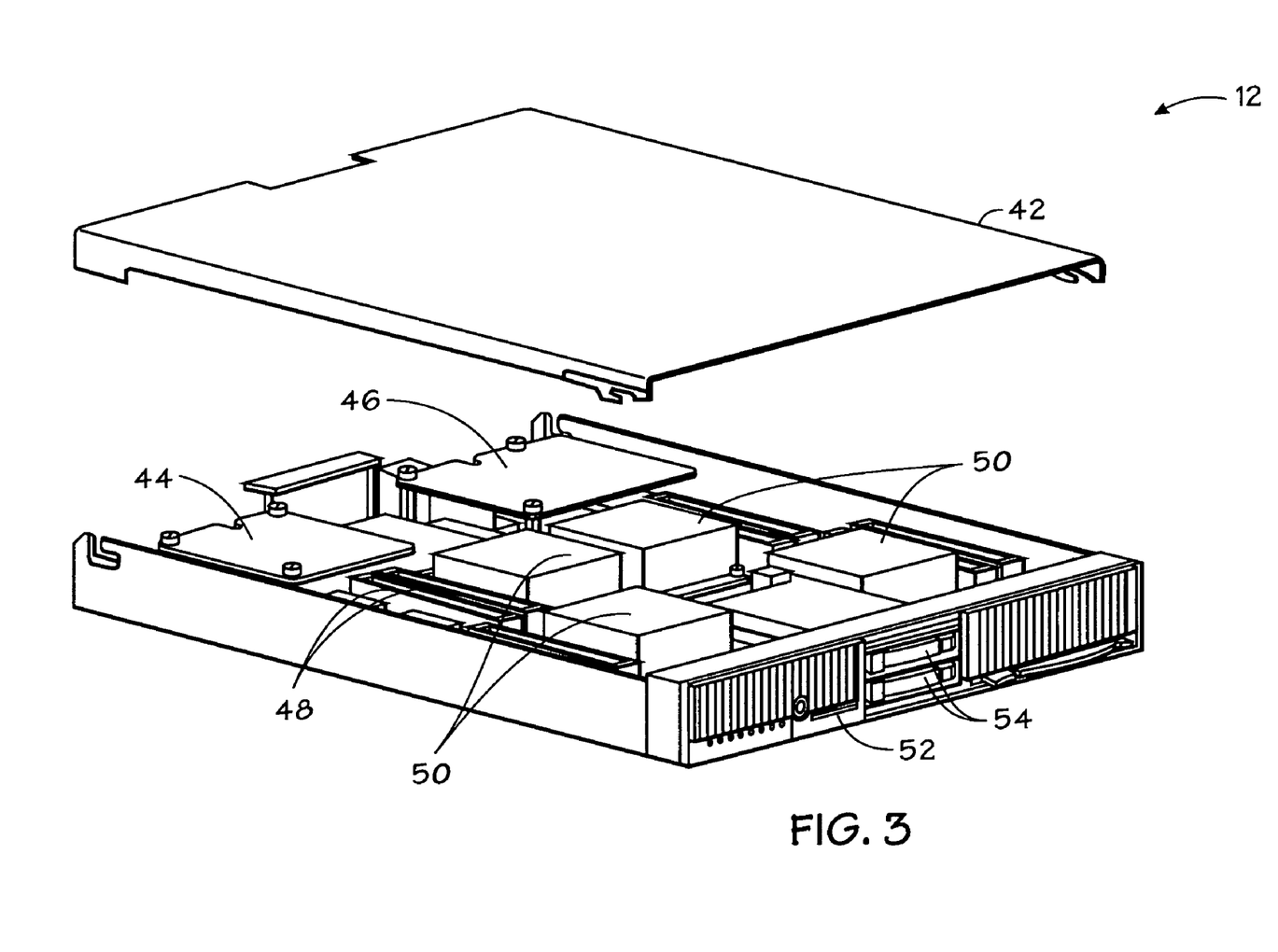
FIG. 3 is a perspective view of a server blade with installed mezzanine cards according to an embodiment of the present invention.

Turning now to FIG. 3, a perspective view of a server blade 12 showing the various components is shown in accordance with an embodiment of the present invention. The server blade has a chassis 40 in which the cover 42 is removed to expose the components. The cover 42 may be removed to install or remove the various components of the server blade, such as mezzanine cards 44 and 46. Although only two mezzanine cards 44 and 46 are visible in FIG. 3, the server blade may include more than two mezzanine card connectors and may include other installed mezzanine cards not shown. As discussed further herein, the mezzanine cards 44 and 46 and other underlying mezzanine cards (not shown) may be installed in a staggered configuration or may span multiple connectors on the system board of the server blade 12.

In addition to the mezzanine cards 44 and 46, the server blade 12 includes any number of other components, some of which are shown in FIG. 3. For example, the embodiment shown includes a memory 48, such as dual in-line memory modules (DIMMS), and processors 50. The server blade 12 shown includes 4 DIMMS and 4 processors, but other embodiments may include any number of DIMMS and processors. The server blade 12 may include various connectors or drive bays to allow for connection of external devices, connection to a network, or addition of storage devices, such as hard disk drives, optical drives, etc. For example, the server blade 12 has one or more external I/O connectors 52 which may be Universal Serial Bus (USB) connectors or any other type of connectors. The server blade 12 also has one or more hot-plug drive bays 54 which provide for addition of hard disk drives, optical drives, etc. Expansion of the server blade 12 may also be accomplished through installation of the mezzanine cards 44 and 46, such as addition of a network interface. Again, the server blade 12 may have multiple configurations and may include components not shown in FIG. 3, such as a video card, display devices, input devices, etc.

Figure 4:
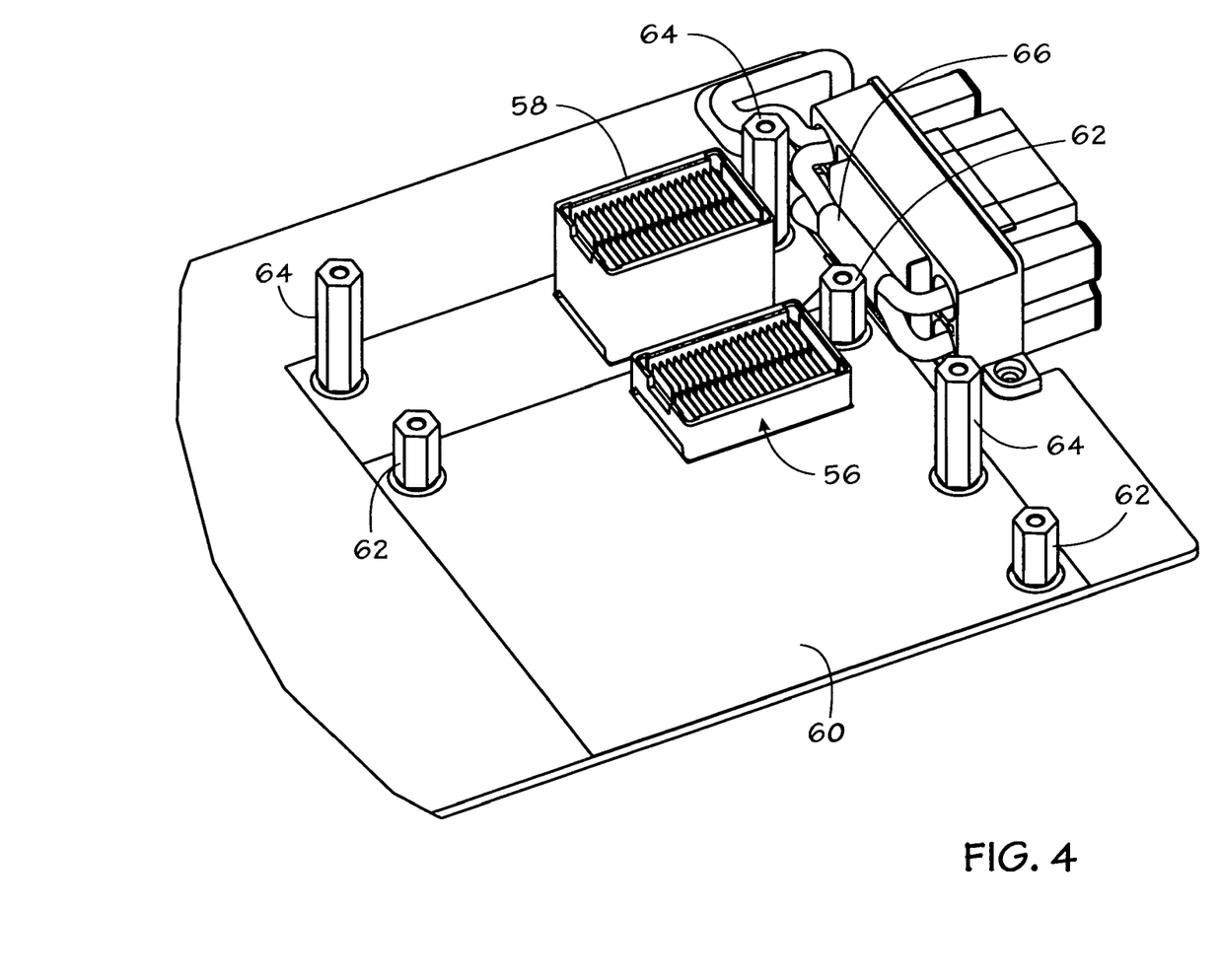
FIG. 4 is a perspective view of a cutaway of the server blade of FIG. 3 according to an embodiment of the present invention.

FIG. 4 depicts a cutaway perspective view of one corner of the server blade 12 of FIG. 3 with mezzanine card connectors 56 and 58 in accordance with an embodiment of the present invention. The connectors 56 and 58 are configured to accept one or more mezzanine cards to add to or provide interfaces or functionality for the server blade 12. The connectors 56 and 58 are coupled to the system board 60. Standoffs 62 and 64 may be coupled to the system board 60 or the chassis 40 and provide support for any installed mezzanine cards.

The connectors 56 and 58 may be any high-speed connector design with sufficient shielding to handle large amounts of data without losses and sufficient durability to withstand installation and removal of any mezzanine cards. Advantageously, the connectors carry both signals and power, as opposed to conventional techniques for mezzanine cards which usually require two or more connectors in a connector assembly to route both signal and power. In one embodiment, the connectors 56 and 58 may be a 200-pin FCI Gigarray connector. The standoffs 62 and 64 may be threaded receptacles configured to receive a captive screw or other screw attached to a mezzanine card.

The connectors 56 and 58 are positioned on the system board 60 and in relation to the chassis 40 to allow for optimum routing and space utilization. For example, as shown in the illustrated embodiment, the conneters 56 and 58 are biased to one corner of the chassis 40 The location of connectors 56 and 58 also provide for additional installation or removal components to aid in installation and removal of the mezzanine cards. For example, the location of connectors 56 and 58 may allow for a lever arm (not shown) to ease disconnection of a mezzanine card from the connector. Further, the position of the connectors 56 and 58 may allow for wire routing 66 behind the connectors 56 and 58 and standoffs 62 and 64. Positioning the connectors 56 and 58 at the corner of the chassis 40 also provides for any connectors on the periphery of any installed mezzanine cards to be located at the back of the chassis 40 and accessible to external cables that use those additional connectors.

As illustrated further below, the connectors 56 and 58 extend from the system board 60 at different heights. For example, in one embodiment connector 56 extends 10 mm from the system board and connector 58 extends 25 mm from the system board. Therefore, as discussed further below, a mezzanine card connected to the connector 56 will be closer to the system board 60 compared to a mezzanine card connected to the connector 58. The connectors 56 and 58 are identical except for the differing extension height from the system board 60. Any mezzanine cards designed to couple to the connector 56 or 58 may therefore have the same connector on the card. The staggered configuration is provided primarily by the different heights of the connectors 56 and 58. Similarly, the standoffs 62 and 64 also extend at different heights from the system board 60. For example, the standoffs 62 may be configured to support a mezzanine card coupled to the connector 56, and may therefore extend 15 mm from the system board 60, thus extending along the height of the connector 56 and any connector on an installed mezzanine cared. Similarly, the standoffs 64 may be configured to support a mezzanine card coupled to the connector 58, and may therefore extend 30 mm from the system board 60.

As will be discussed further below, alternative embodiments may include more than two mezzanine card connectors, and/or mezzanine cards capable of spanning multiple connectors. In some embodiments, in addition to the connectors 56 and 58, a system board in a server blade 12 may have a third mezzanine card connector. In such an embodiment, a mezzanine card may span multiple mezzanine card connectors. For example, a larger mezzanine card that spans two mezzanine card connectors may offer increased I/O throughput through the use of both mezzanine card connectors. In further embodiments that have three or more mezzanine card connectors, a mezzanine card that connects to three or more mezzanine card connectors may be used.

Figure 5:
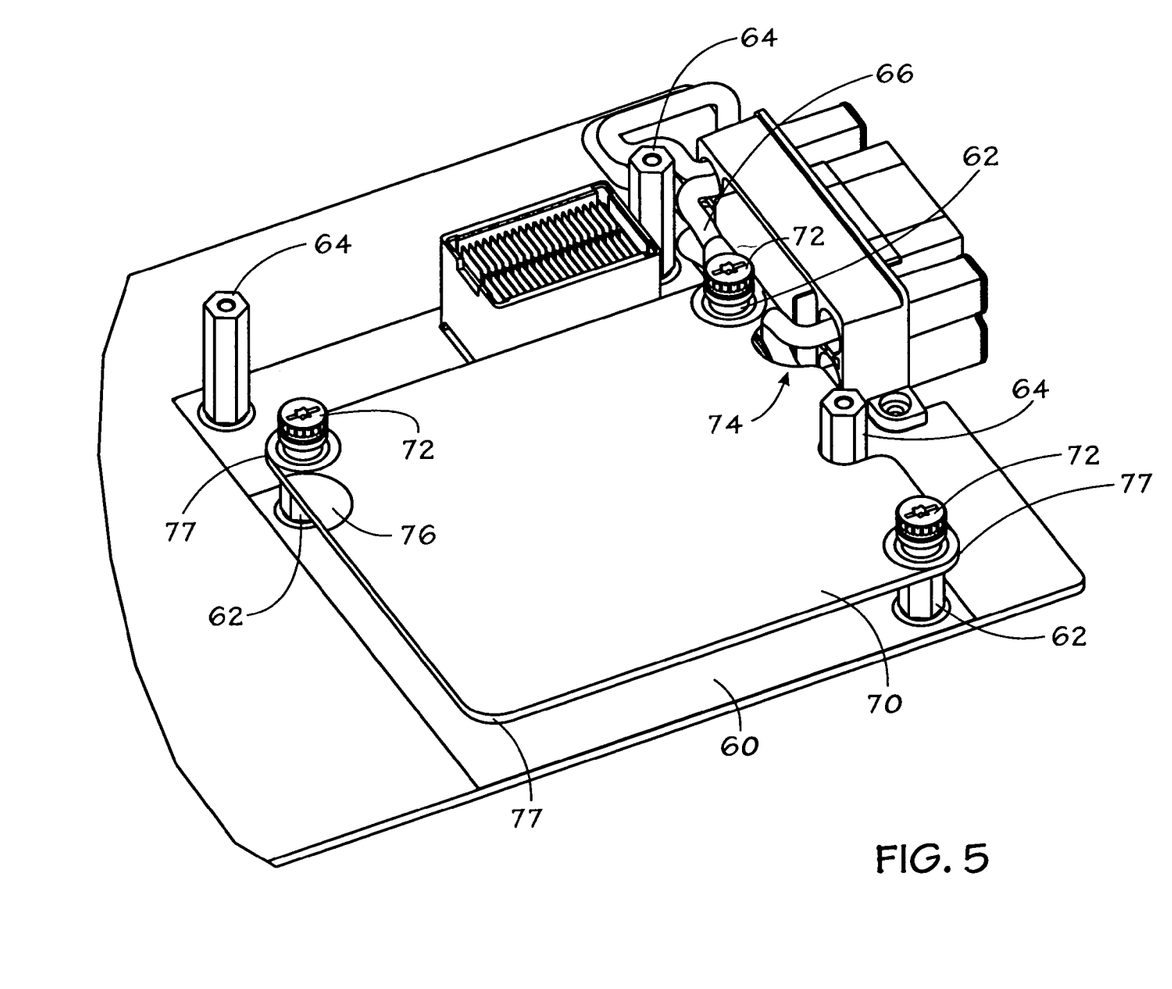
FIG. 5 is a perspective view of a cutaway of the server blade of FIG. 3 showing one mezzanine card installed in accordance with an embodiment of the present invention.

FIG. 5 depicts a cut-away perspective view of the server blade 12 with a mezzanine card 70 installed onto the connector 56. As illustrated in FIG. 5, the installed card 70 provides enough space such that the connector 58 may still be used. In addition to utilizing the connector 56, the card 70 also utilizes the standoffs 62 to secure the card to the system board 60. The card 70 is coupled to the standoffs 62 by captive screws 72. The standoffs 62 and the captive screws 72 may be any type of fastener and receptacle, threaded or otherwise, that allow secure attachment of the card 70 to the system board 60. The card 70 has a connector (not shown) on the underside of the card to connect to connector 56. In one embodiment, the connector on the underside of the card 70 extends from the card at a distance of 5 mm. Because the height of the connector 56 is 10 mm, in one embodiment the installed card 70 will be at a height of 15 mm from the system board 60. Although the distance between the card 70 and the system board 60 may vary in different embodiments, the height of the mezzanine card 70 may be designed to allow for necessary components and air circulation for cooling on the system board 60.

In the embodiment shown in FIG. 5, the mezzanine card 70 includes features to aid in installation and removal. The mezzanine card 70 may be designed to allow for other supports and/or mechanical or electrical components in server blade 12. For example, the card 70 has notches 74 to allow for the standoffs 64 and the wire routes 66. In addition, the mezzanine card 70 includes a silk-screened area 76 that may be used during installation and removal of the card 70. For example, during removal of the card 70, the silk-screened area 76 provides a safe and secure area for a technician to grab the card 70. During manufacture of the card 70, no components or conductive traces are manufactured onto the silk-screened area 76, thus reducing the risk of damage to components on the card 70 if the technician uses the silk-screened area 76 when installing, removing, or otherwise touching the card 70.

Finally, the card 70 includes rounded the corners 77, avoiding sharp or pointed edges that may damage the hands of a technician.

Figure 6:
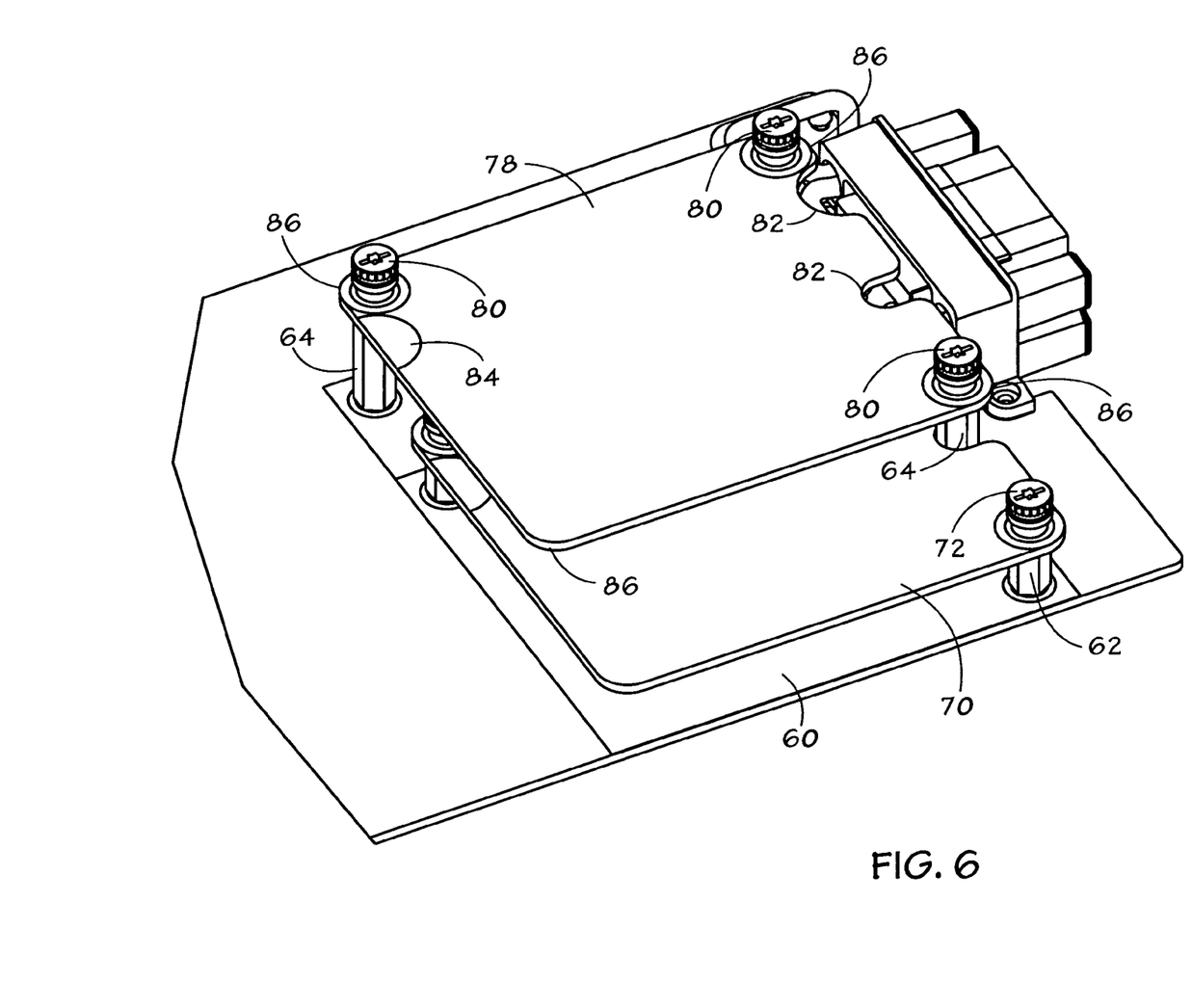
FIG. 6 is a perspective view of a cutaway of the server blade of FIG. 3 showing two mezzanine cards installed in accordance with an embodiment of the of the present invention.

Turning now to FIG. 6, a second mezzanine card 78 is installed on connector 58. Similarly to the card 70, the second card 78 uses standoffs 64 for attachment to system board 60. The second card 78 is coupled to the standoffs 64 by the captive screws 80, but any type of fastener and/or receptacle may be used. The card 78 has a connector (not shown) on the underside of the card that connects to the connector 58. As shown in FIG. 6, the connector 58, the standoffs 64, and the connector on the underside of the second card 78 provide enough height so that the second card 78 can be installed over the card 70 in a staggered configuration. For example, in the embodiment shown the connector on the underside of the second card 78 extends 5 mm from the second card 78. As discussed above, the connector 58 and the standoffs 64 extend at a height of 25 mm from the system board 60. Thus, the installed second card 78 is at a height of 30 mm from the system board 60. The distance between the second card 78 and the card 70, e.g. 15 mm, may provide enough space for components, heat sinks, and air circulation for cooling between the second card 78 and the card 70. Additionally, the staggered configuration minimizes the footprint used by installation of both the cards 70 and 78 on the adjacent connectors 56 and 58. The second card 78 also includes those features designed to aid in removal or installation of the card 78. For example, the card 78 includes notches 82, silkscreened area 84, and rounded corners 86.

Advantageously, the mezzanine cards 70 and 78 shown in the embodiment illustrated in FIGS. 5 and 6 are identical and may be a Type I card or Type II card, as discussed above. Because the cards 70 and 78 are identical, either card may be installed on the connector 56 or the connector 58. Additionally, the use of identical cards with the same dimensions, connectors, and footprints allows for use across many different server designs, as long as the necessary footprint space and connectors are provided on the system board of those designs. The connectors 56 and 58 may also receive a Type II card having slightly larger dimensions, and either a Type I or Type II card or any combination thereof may be used in the staggered configuration show in FIG. 6.

Figure 7:
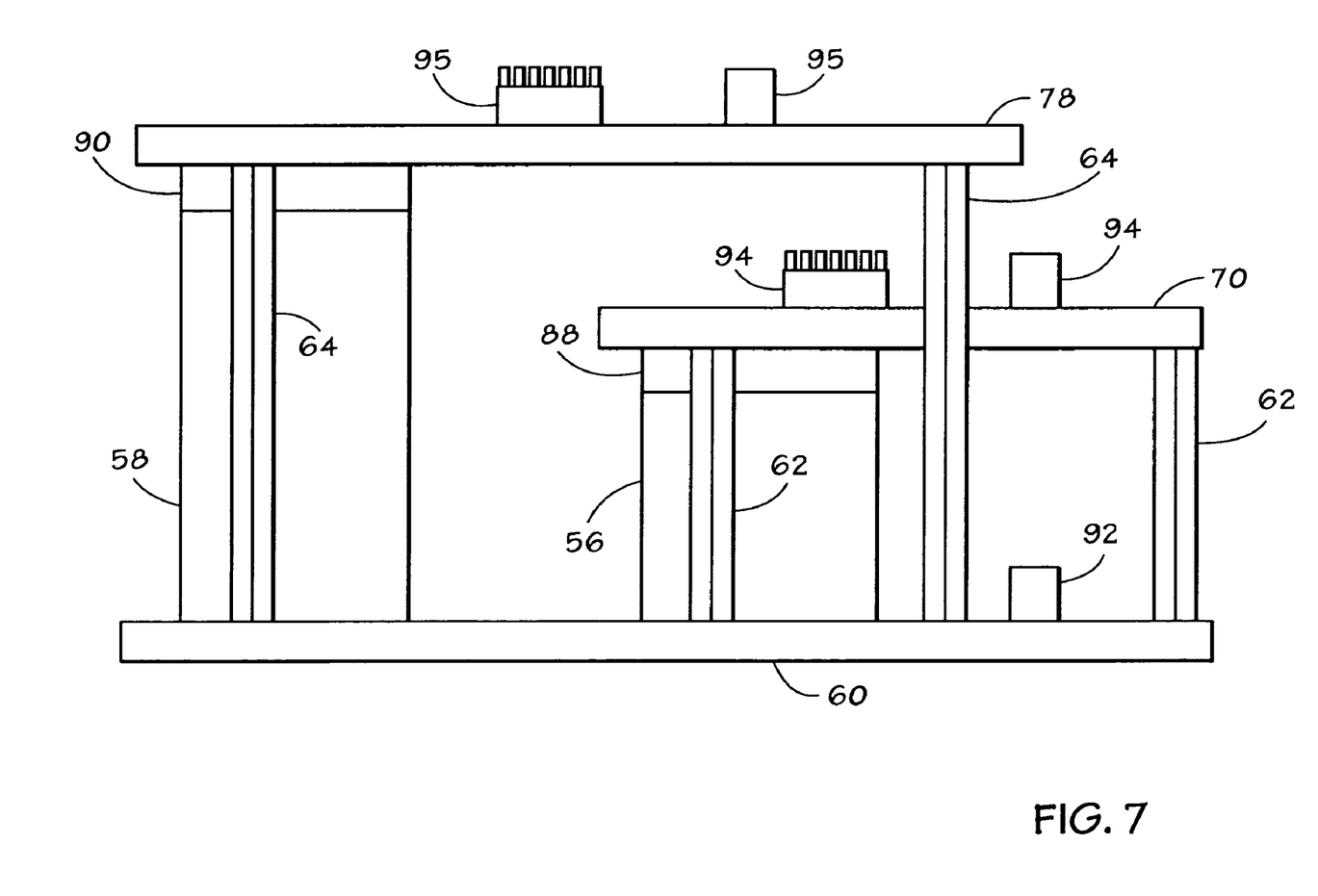
FIG. 7 is a side view of the cutaway of FIG. 6 in accordance with an embodiment of the present invention.

FIG. 7 depicts a side view of the installed mezzanine card 70 and 78 of FIG. 6 according to an embodiment of the present invention. As can be more clearly seen in FIG. 7, the cards 70 and 78 are installed in a staggered configuration such that a portion of the second card 78 overlaps a portion of the card 70. In addition, various components on the system board 60, and the cards 70 and 78, may require sufficient space for cooling and air circulation. As discussed above, this space is provided through a combination of connector and standoff heights on the system board and connectors on the cards themselves. The card 70 includes a connector 88 and the second card 78 includes a connector 90. As discussed above, in one embodiment the card connectors 88 and 90 extend 5 mm from the underside of the cards 70 and 78 respectively. Advantageously, the uniform length of the connector on cards 70 and 78 and other mezzanine cards (such as any Type I, Type II, or Type III card) provides for the design flexibility and platform sharing advantages discussed above. The connectors used on the cards 70 and 78 may also have no exposed pins and therefore be chosen to minimize damage to the connector during handling of the cards 70 and 78. In one embodiment, the connectors used may be 200-pin FCI Gigarray connectors.

The combined height of the connectors 56 and 88, and the standoffs 62, must be of sufficient height to provide for one or more components 92 on the system board 60, such heat sinks, capacitors, processors, fans, etc. In one embodiment, as discussed above, the connector 56 and the standoffs 62 are at a height of 10 mm and the card 70 includes a 5 mm height connector 88. Thus, the height of the card 70 compared to the system board 60 is 15 mm. Analogously, in one embodiment, the connector 58 and the standoffs 64 may be at a height of 25 mm, and the second card 78 may include a connector 90 extending 5 mm. Therefore, when the card 78 is installed, the height of the card 78 over the system board 60 is 30 mm, and the distance between the card 70 and the second card 78 is 15 mm. Additionally, the card 70 may have one or more components 94, such as capacitors, heat sinks, processors, fans, or other components that require sufficient space, as well as space for cooling and air circulation around the components 92. The card 78 may also have one or more components 95 such as capacitors, heat sinks, processors, fans, or other components.

Figure 8:
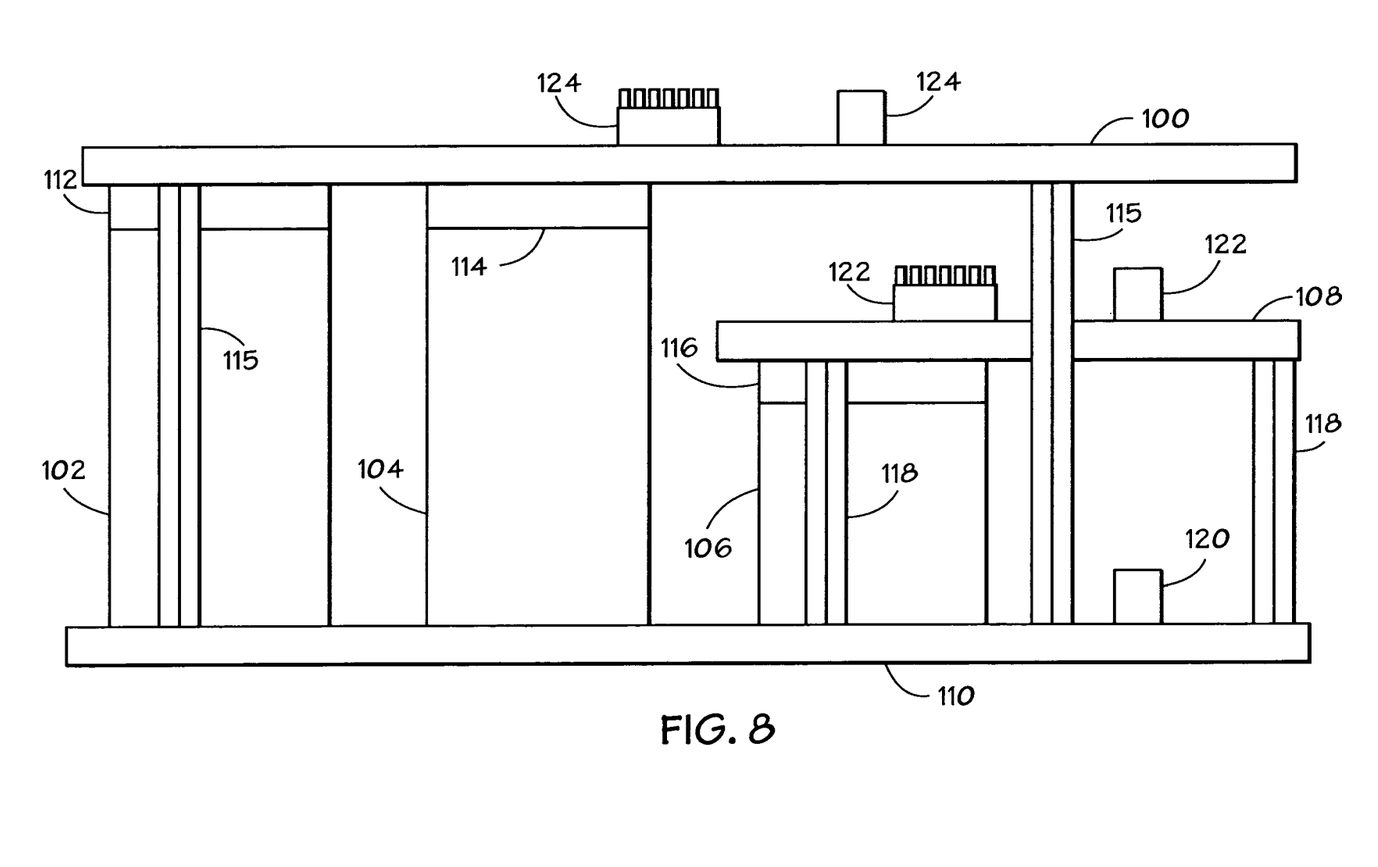
FIG. 8 is a side view of a cutaway of a server blade showing a mezzanine card spanning two connectors in accordance with an embodiment of the present invention.

FIG. 8 depicts another embodiment of a mezzanine card 100 installed on multiple mezzanine card connectors 102 and 104 in accordance with an embodiment of the present invention. FIG. 8 is a side view of the mezzanine card 100 and smaller mezzanine card 108 installed on a server blade 12 having connectors 102, 104, and 106 extending from a system board 110. The configuration, spacing, and arrangement of the connectors 102, 104, and 106 on the system board 110 are similar to the system discussed in FIGS. 3-7. For example, the connectors 102, 104, and 106 may be positioned on the system board 110 to allow for optimum routing and space utilization. The connectors 102, 104, and 106 may be biased to one corner of the system board 60, and the location of the connectors 102, 104, and 106 may provide for additional installation or removal components, such as a lever arm (not shown), to aid in installation and/or removal of the mezzanine cards 100 and 108. The positioning of the connectors 102, 104, and 106 may allow for wire routing behind the connectors and standoffs, and may provide that any connectors on any mezzanine cards installed on the connectors 102, 104, and 106 are located at the back of the chassis of the server blade 12 and accessible to external cables that use the additional connectors.

Instead of utilizing one connector, as in the embodiment discussed above in FIGS. 3-7, the mezzanine card 100 spans two connectors 102 and 104 to increase I/O throughput. For example, if each connector 102 and 104 is capable, at most, of x8 throughput, then utilization of both the connectors 102 and 104 will result in x16 I/O throughput. The mezzanine card 100 may be a Type III mezzanine card as discussed above, as the larger size may accommodate multiple connectors on the card.

The connectors 102 and 104 are similar to connector 106 except for the height they extend from the system board 110. For example, connectors 102, 104, and 106 may each carry both signal and power required for operation of the mezzanine cards installed on the connectors. In one embodiment, the connectors 102, 104, and 106 may each be a 200-pin FCI Gigarray connector. In order to span two connectors 102 and 104, the card 100 may include two connectors 112 and 114 on the underside of the card. The connectors 102 and 104 may extend 5 mm from the underside of the card 100, similar to the other mezzanine card connector embodiments discussed herein. The connectors 112 and 114 may also each be a 200-pin FCI Gigarray connector. The embodiment shown may include one or more standoffs 115 that provide for further attachment of the card 100 to the system board 110 or chassis of the server blade 12. Captive screws 117 may be included on card 100 to secure the card to the standoffs 115.

The second mezzanine card 108 may be a Type I or Type II mezzanine card, as discussed above. The second mezzanine card 108 may include a connector 116 on the underside of the card 108. The connector 116 on the underside of the card connects to the connector 106. In addition, one or more standoffs 118 may be provided for attachment of the card 108 to the system board 110 or chassis of the server blade 12. Captive screws 119 may be included on the card 108 to secure the card to the standoffs 118.

To provide for a staggered configuration between mezzanine cards 100 and 108, the connectors 102 and 104 extend at a different height from system board 110 than connector 106. Thus, when installed on connectors 102 and 104 and standoffs 115, the card 100 is higher or at a greater distance from the system board 110 than the smaller card 108. Again, as discussed above, the staggered configuration allows the mezzanine cards 100 and 108 to fit in the smallest footprint possible, as well as allowing space for all necessary components, such as capacitors, heat sinks, processors, fans, or other components. For example, the height of the installed card 108 may provide enough space for components 120 on the system board 110. Similarly, the height of the installed card 100 may provide enough space for components 122 on the card 108. Further, the distance between the card 100 and the server blade cover may provide enough space for components 124 on the card 100. In one embodiment, the connectors 102 and 104 may be at a height of 25 mm, and the standoffs 115 at a height of 30 mm. Because the connectors 112 and 114 on card 100 may have a height of 5 mm, when installed, card 100 will be 30 mm from the system board 110. Similarly, the connector 106 may extend at a height of 10 mm from the system board 110, and the standoffs 118 may extend at a height of 15 mm. The connector 116 on the card 108 may extend 5 mm from the underside of the card, so when installed the card 108 will be 15 mm from the system board 110.

Although the embodiments discussed herein depict two mezzanine cards installed, in some embodiments multiple mezzanine cards may be installed at varying heights by using multiple connectors. Further, numerous configurations or sizes of blade servers may utilize any number of mezzanine cards and/or system board connectors. For example, one embodiment of a blade server may have a chassis height sufficient only for two mezzanine cards in a staggered arrangement as discussed above. In such an embodiment, only two connectors may be used. However, in another embodiment, the blade server may have a chassis height sufficient for three mezzanine cards in a staggered arrangement and would utilize three connectors. In yet other embodiments, any number of connectors and any number of mezzanine cards at staggered heights may be used. Because the connectors, mezzanine cards, and connectors on the mezzanine cards may be standardized, mezzanine cards may be shared across multiple blade server designs. Further, because the connectors, spacing of the mezzanine cards, and routing around the connectors in the mezzanine cards may be standardized, such mezzanine cards described herein may allow for upgraded designs for use with future blade servers and I/O architectures.

What is claimed is:

1. A computer system, comprising:
   a chassis;
   a system board coupled to the chassis;
   a first signal/power connector extending from the system board at a first height and configured to receive a first printed circuit board, wherein the first printed circuit board is configured to be parallel to the system board when received by the first signal/power connector;
   a second signal/power connector extending from the system board at a second height and configured to receive a second printed circuit board, wherein the second printed circuit board is configured to be parallel to the system board when received by the second signal/power connector, and wherein the first and second printed circuit boards are interchangeably connected to either the first or second signal/power connectors; and
   at least one standoff for each signal/power connector, the at least one standoff extending from the system board at a same height as the corresponding signal/power connector to provide support for installed printed circuit boards.

2. The computer system of claim 1, wherein the first printed circuit board comprises a first mezzanine card and second printed circuit board comprises a second mezzanine card.

3. The computer system of claim 1, wherein all or a portion of the second printed circuit board extends over all or a portion of the first printed circuit board.

4. The computer system of claim 1, wherein the first connector extends about 10 mm from the system board.

5. The computer system of claim 1, wherein the second connector extends about 25 mm from the system board.

6. The computer system of claim 1, comprising a third connector extending from the system board at a third height and configured to receive a third printed circuit board, wherein the third printed circuit board is configured to be parallel to the system board when received by the third connector.

7. The computer system of claim 6, wherein all or a portion of the third printed circuit board extends over all or a portion of the first printed circuit board and/or all or a portion of the second printed circuit board.

8. The computer system of claim 7, wherein the third connector extends about 25 mm from the system board.

9. The computer system of claim 6, wherein the first printed circuit board, the second printed circuit board, and the third printed circuit each comprise a mezzanine card.

10. The computer system of claim 6, wherein each of the first printed circuit board, the second printed circuit board, and third printed circuit board comprises a respective printed circuit board connector extending from the printed circuit board and configured to connect to the first connector, the second connector, and the third connector respectively.

11. A computer system comprising,
    a first mezzanine card connected to a system board via a first connector extending from a system board; and
    a second mezzanine card connected to a system board via a second connector and a third connector extending from a system board;
    wherein each of the connectors are the same and each of the connectors provide signals and power to the respective mezzanine cards; and
    a first standoff corresponding to the first connector, the first standoff connected to the system board and extending from the system board at a same height as the first connector;
    a second standoff corresponding to the second connector, the second standoff connected to the system board and extending from the system board at a same height as the second connector; and
    a third standoff corresponding to the third connector, the third standoff connected to the system board and extending from the system board at a same height as the third connector.

12. The computer system of claim 11, wherein the second connector and the third connector extend from the system board at a height different than the first connector.

13. The computer system of claim 11, wherein all or a portion of the second mezzanine card extends over all or a portion of the first mezzanine card.

14. The computer system of claim 11, wherein the first connector extends about 15 mm from the system board.

15. The computer system of claim 11, wherein the second connector and the third connector extend about 25 mm from the system board.

16. A computer system, comprising:
   a chassis;
   a system board coupled to the chassis;
   a plurality of identical connectors extending from the system board and configured to receive a plurality of standardized printed circuit boards, wherein each of the identical connectors extends at a plurality of heights from the system board, and wherein each of the identical connectors is configured to provide both power and signals to the plurality of standardized printed circuit boards;
   wherein each of the plurality of standardized printed circuit boards may be received by more than one of the plurality of identical connectors and are configured to be parallel to the system board when connected to the plurality of identical connectors; and
   a plurality of threaded receptacles configured to receive a screw attached to the standardized printed circuit boards, the threaded receptacles provided at different heights to provide support for the standardized printed circuit boards regardless of which of the identical connectors the standardized printed circuit boards are attached to.

17. The computer system of claim 16, wherein all or a portion of each of the plurality of standardized printed circuit boards may extend over all or a potion of another of the plurality of standardized printed circuit boards when received by the plurality of identical connectors.

* * * * *

UNITED STATES PATENT AND TRADEMARK OFFICE
CERTIFICATE OF CORRECTION

| | | |
|---|---|---|
| PATENT NO. | : 7,746,654 B2 | Page 1 of 1 |
| APPLICATION NO. | : 11/811311 | |
| DATED | : June 29, 2010 | |
| INVENTOR(S) | : John P. Franz et al. | |

It is certified that error appears in the above-identified patent and that said Letters Patent is hereby corrected as shown below:

In column 12, line 15, in Claim 17, delete "potion" and insert -- portion --, therefor.

Signed and Sealed this

Twelfth Day of October, 2010

David J. Kappos
*Director of the United States Patent and Trademark Office*